(12) United States Patent
Sato et al.

(10) Patent No.: US 12,110,589 B2
(45) Date of Patent: Oct. 8, 2024

(54) METHODS FOR METAL OXIDE POST-TREATMENT

(71) Applicant: Applied Materials, Inc., Santa Clara, CA (US)

(72) Inventors: Tatsuya E. Sato, San Jose, CA (US); Wei Liu, San Jose, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 16/631,979

(22) PCT Filed: Aug. 1, 2018

(86) PCT No.: PCT/US2018/044771
§ 371 (c)(1),
(2) Date: Jan. 17, 2020

(87) PCT Pub. No.: WO2019/028120
PCT Pub. Date: Feb. 7, 2019

(65) Prior Publication Data
US 2020/0165725 A1 May 28, 2020

Related U.S. Application Data

(60) Provisional application No. 62/540,020, filed on Aug. 1, 2017.

(51) Int. Cl.
*C23C 16/455* (2006.01)
*C23C 16/40* (2006.01)
*H01L 21/02* (2006.01)

(52) U.S. Cl.
CPC ...... *C23C 16/45553* (2013.01); *C23C 16/403* (2013.01); *C23C 16/4554* (2013.01);
(Continued)

(58) Field of Classification Search
CPC ............ C23C 16/45553; C23C 16/403; C23C 16/4554; C23C 16/45548; H01L 21/02178; H01L 21/0228; H01L 21/0234
See application file for complete search history.

(56) References Cited

U.S. PATENT DOCUMENTS

| 7,033,957 B1 * | 4/2006 | Shiraiwa ............. H01L 21/3144 438/770 |
| 7,244,313 B1 | 7/2007 | Zhou et al. |
| 7,910,481 B2 | 3/2011 | Park et al. |
| 9,214,333 B1 * | 12/2015 | Sims ..................... C23C 16/52 |
| 9,299,583 B1 | 3/2016 | Wang et al. |

(Continued)

FOREIGN PATENT DOCUMENTS

| CN | 101162688 A | 4/2008 |
| CN | 101379213 A | 3/2009 |

(Continued)

OTHER PUBLICATIONS

PCT International Search Report and Written Opinion in PCT/US2018/044771 dated Nov. 16, 2018, 9 pages.

(Continued)

*Primary Examiner* — Kelly M Gambetta
(74) *Attorney, Agent, or Firm* — Servilla Whitney LLC

(57) ABSTRACT

Methods comprising forming a metal oxide film by atomic layer deposition using water as an oxidant are described. The metal oxide film is exposed to a decoupled plasma comprising one or more of He, H2 or O2 to lower the wetch etch rate of the metal oxide film.

7 Claims, 6 Drawing Sheets

(52) U.S. Cl.
CPC ............... *C23C 16/45548* (2013.01); *H01L 21/02178* (2013.01); *H01L 21/0228* (2013.01); *H01L 21/0234* (2013.01)

(56) References Cited

U.S. PATENT DOCUMENTS

| | | |
|---|---|---|
| 2003/0134513 A1 | 7/2003 | Li et al. |
| 2005/0017319 A1* | 1/2005 | Manabe ............ H01L 21/28202 257/498 |
| 2006/0162863 A1 | 7/2006 | Kim et al. |
| 2007/0251917 A1 | 11/2007 | Bera et al. |
| 2013/0052827 A1 | 2/2013 | Wang et al. |
| 2013/0093064 A1* | 4/2013 | Lin ................... H01L 21/02337 257/637 |
| 2014/0023794 A1 | 1/2014 | Mahajani et al. |
| 2014/0028190 A1* | 1/2014 | Voronin ................ H05H 1/46 315/111.21 |
| 2016/0138161 A1 | 5/2016 | Chen et al. |

FOREIGN PATENT DOCUMENTS

| | | |
|---|---|---|
| JP | 2006019442 A | 1/2006 |
| JP | 2006173301 A | 6/2006 |
| JP | 201422653 A | 2/2014 |
| KR | 20050062132 A | 6/2005 |
| KR | 100746629 B1 | 7/2007 |
| KR | 20100125921 A | 12/2010 |

OTHER PUBLICATIONS

Khalique, U., et al., "Investigation of Al2O3 Deposited by ALD as Passivation Layers for InP-based Nano Lasers", Proceedings Symposium IEEE/LEOS Benelux Chapter, 2008, Twente, pp. 195-198.
Yang, Xeng, et al., "Dry Etching of Al2O3 Thin Films in O2/BCl3/Ar Inductively Coupled Plasma", Transactions on Electrical and Electronic Materials, vol. 11, No. 5, Oct. 25, 2010, pp. 202-205.

* cited by examiner

METHODS FOR METAL OXIDE POST-TREATMENT

CROSS-REFERENCE TO RELATED APPLICATIONS

This application is the National Stage entry of PCT/US18/44771, filed on Aug. 1, 2018, which claims priority to United States Provisional Application. Ser. No. 62/540,020, filed Aug. 1, 2017, the entire disclosures of which are hereby incorporated herein in their entireties.

TECHNICAL FIELD

The present disclosure relates generally to methods of depositing thin films. In particular, the disclosure relates to processes for the selective deposition of aluminum oxide films with post-deposition plasma treatment.

BACKGROUND

Thin films are widely used in semiconductor fabrication for many processes. For example, thin films (e.g., aluminum oxide) are used in multi-patterning processes as spacer materials to achieve smaller device dimensions without employing the most expensive EUV lithography technology.

Traditional fabrication processes include conformal film deposition on 3D structures (e.g., fins) followed by wet or dry etching to remove portions of the layer. The removability or the etch resistance of the film can affect the process uniformity, repeatability and accuracy. Changing the wet or dry etch rate of the film without affecting film thickness could provide greater control over patterning applications.

Therefore, there is a need in the art for processes of controlling the wet or dry etch rates of films.

SUMMARY

One or more embodiments of the disclosure are directed to methods comprising forming a metal oxide film on a substrate surface by ALD using water as an oxidant. The metal oxide film is exposed to a decoupled plasma comprising one or more of He, $H_2$ or $O_2$, to lower the wet etch rate of the metal oxide film.

Additional embodiments of the disclosure are directed to methods comprising forming an aluminum oxide film on a substrate surface by sequential exposure to an aluminum precursor and water. The aluminum oxide film is exposed to a decoupled plasma comprising a mixture of oxygen and helium. The decoupled plasma has a source power and no bias.

Further embodiments of the disclosure are directed to methods comprising forming an aluminum oxide film on a substrate surface by sequential exposure to an aluminum precursor and water. The aluminum oxide film is exposed to a decoupled plasma consisting essentially of helium. The decoupled plasma has a source power and a bias power.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
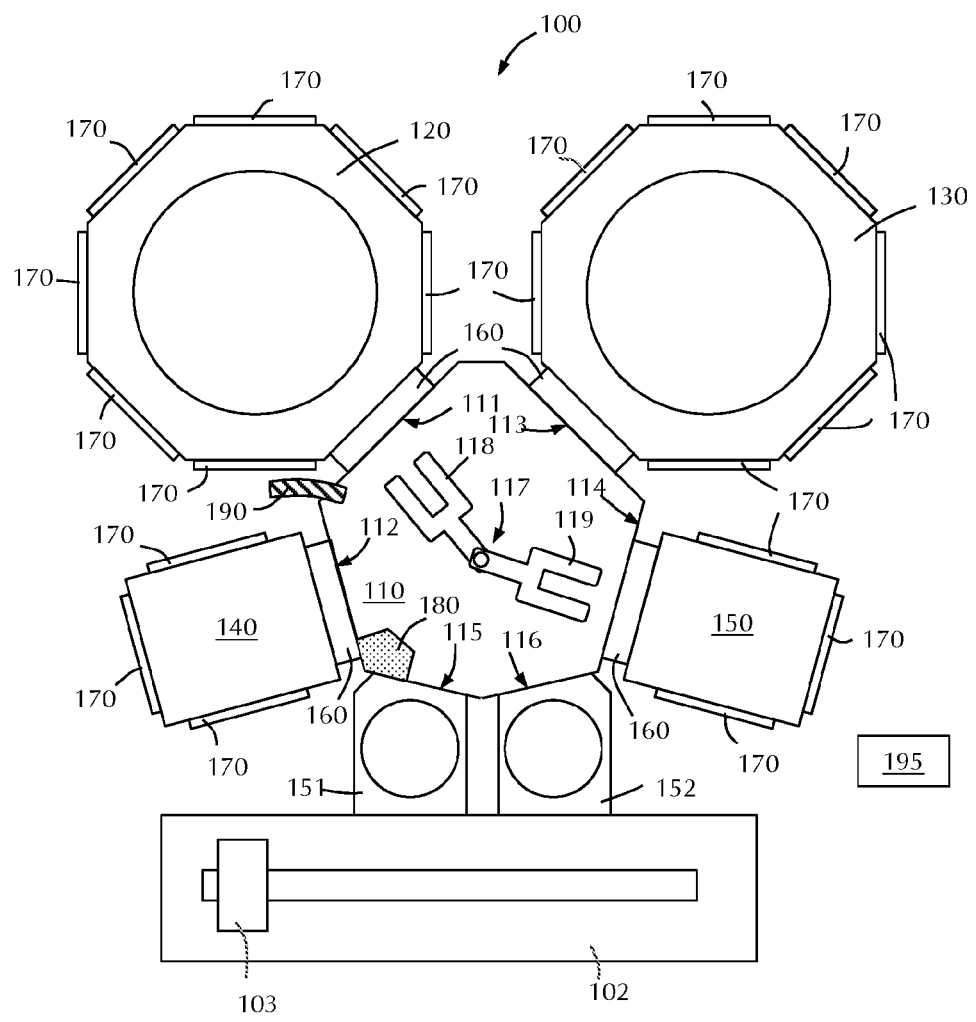
FIG. 1 shows a schematic view of a processing platform in accordance with one or more embodiment of the disclosure.

FIG. 1 shows a processing platform 100 in accordance with one or more embodiment of the disclosure. The embodiment shown in FIG. 1 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The transfer station 110 shown has a first side 111, a second side 112, a third side 113, a fourth side 114, a fifth side 115 and a sixth side 116. Although six sides are shown, those skilled in the art will understand that there can be any suitable number of sides to the transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A batch processing chamber 120 can be connected to a first side 111 of the central transfer station 110. The batch processing chamber 120 can be configured to process x wafers at a time for a batch time. In some embodiments, the batch processing chamber 120 can be configured to process in the range of about four (x=4) to about 12 (x=12) wafers at the same time. In some embodiments, the batch processing chamber 120 is configured to process six (x=6) wafers at the same time. As will be understood by the skilled artisan, while the batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
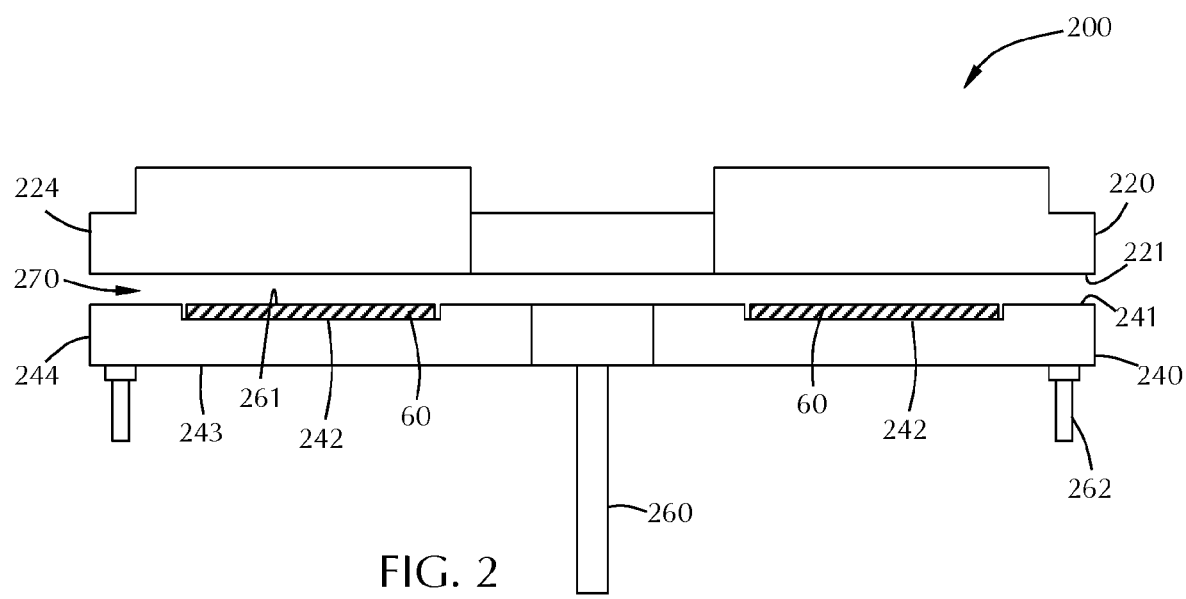
FIG. 2 shows a cross-sectional view of a batch processing chamber in accordance with one or more embodiment of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
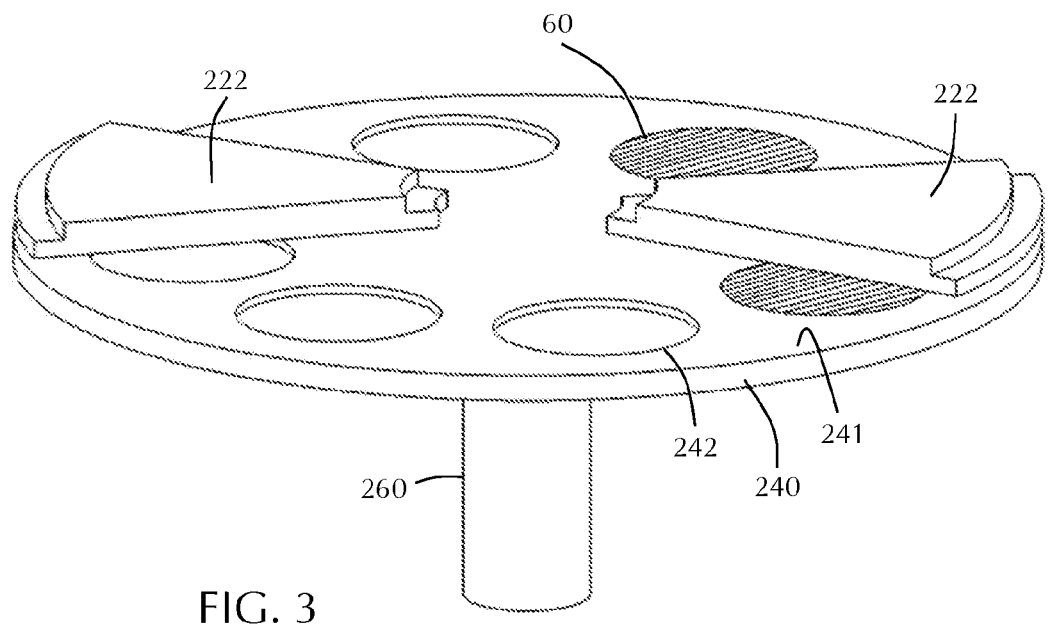
FIG. 3 shows a partial perspective view of a batch processing chamber in accordance with one or more embodiment of the disclosure.

In some embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

A susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The recess 242 can be any suitable shape and size depending on the shape and size of the substrates 60 being processed. In the embodiment shown in FIG. 2, the recess 242 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In some embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In some embodiments, there are a sufficient number of pie-shaped injector units 222 to form a shape conforming to the shape of the susceptor assembly 240. In some embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
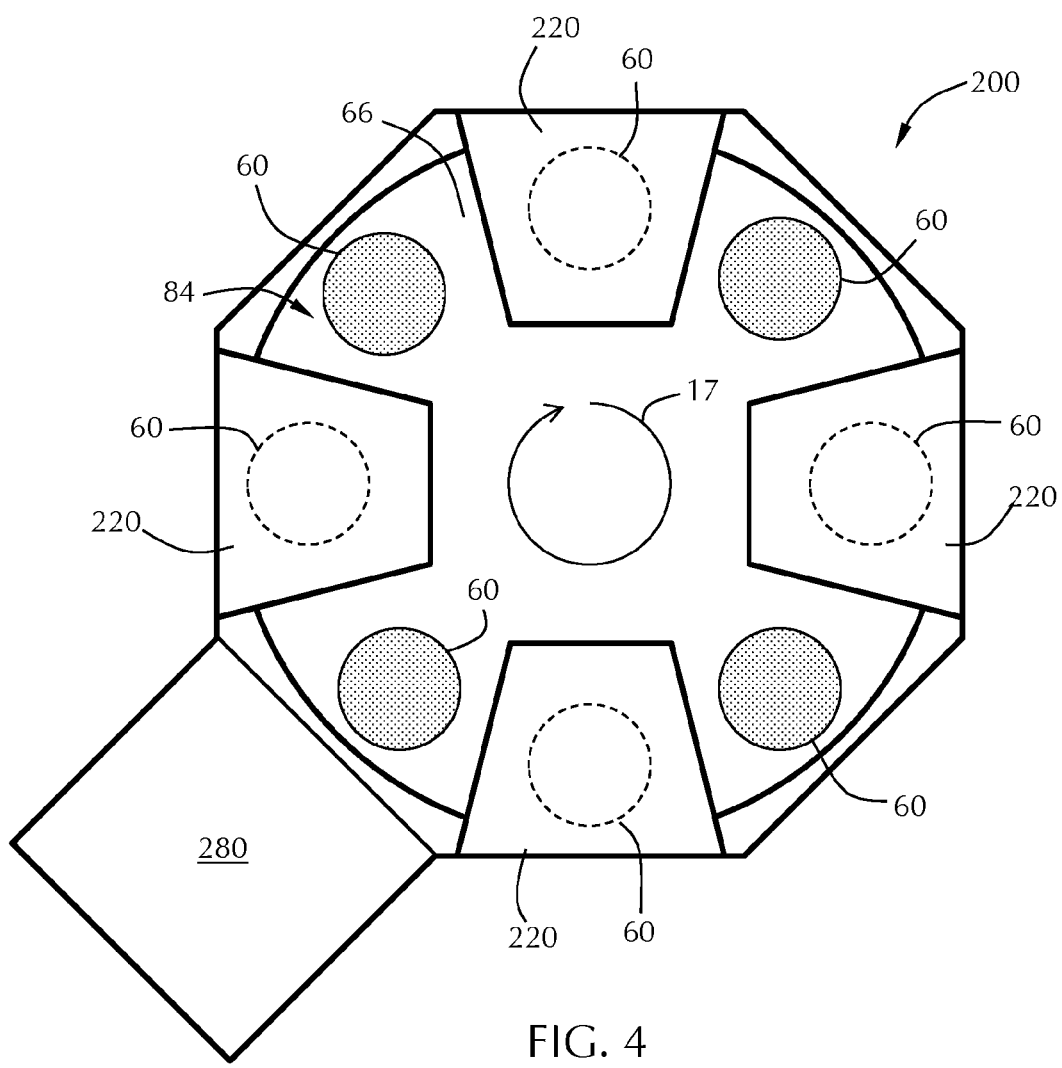
FIG. 4 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiment shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station. This chamber 280 is connected to a side of the processing chamber 200 to allow, for example the substrates (also referred to as substrates 60) to be loaded/unloaded from the chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 5:
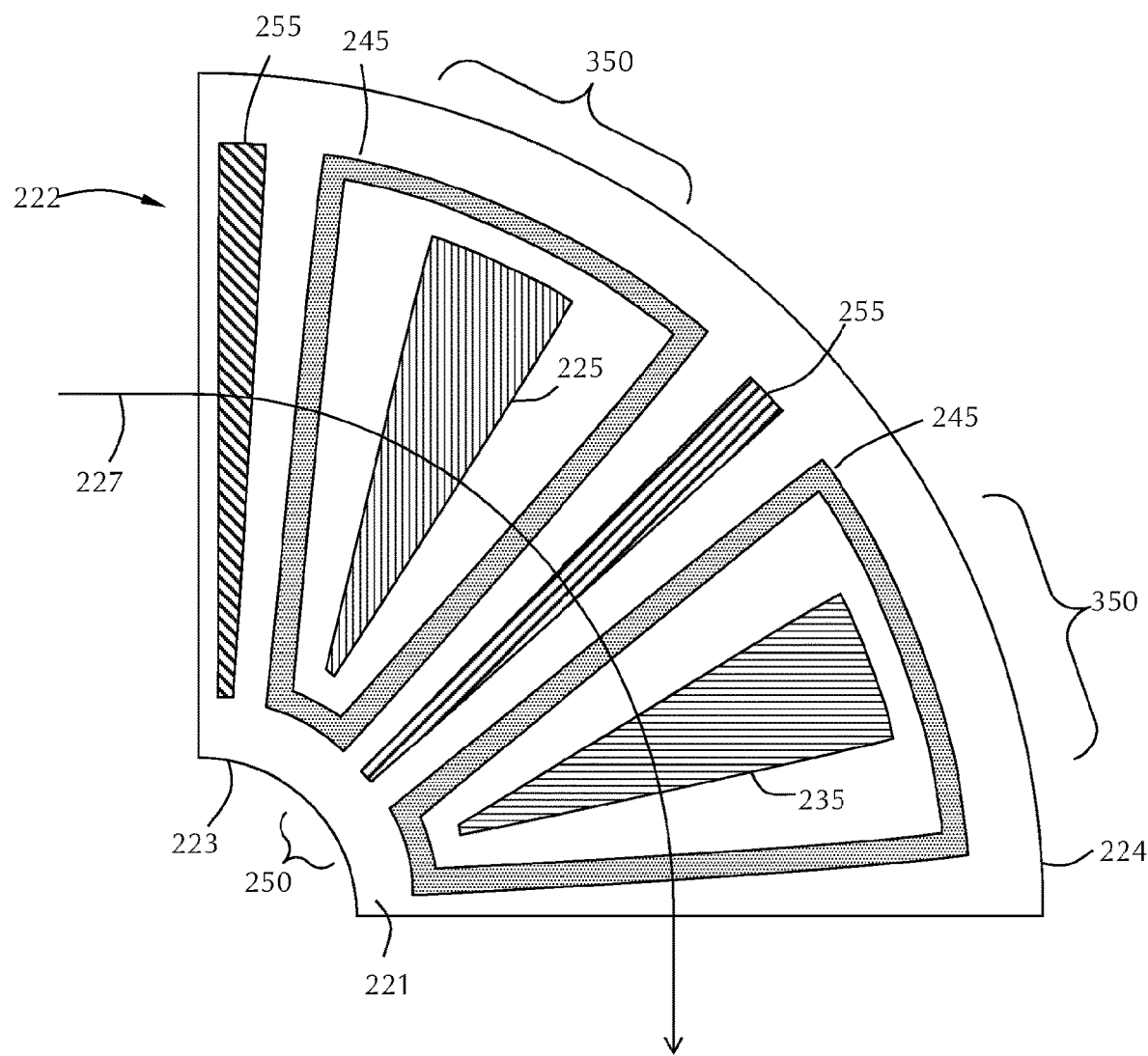
FIG. 5 shows a schematic view of a portion of a wedge shaped gas distribution assembly for use in a batch processing chamber in accordance with one or more embodiment of the disclosure.
Figure 6:
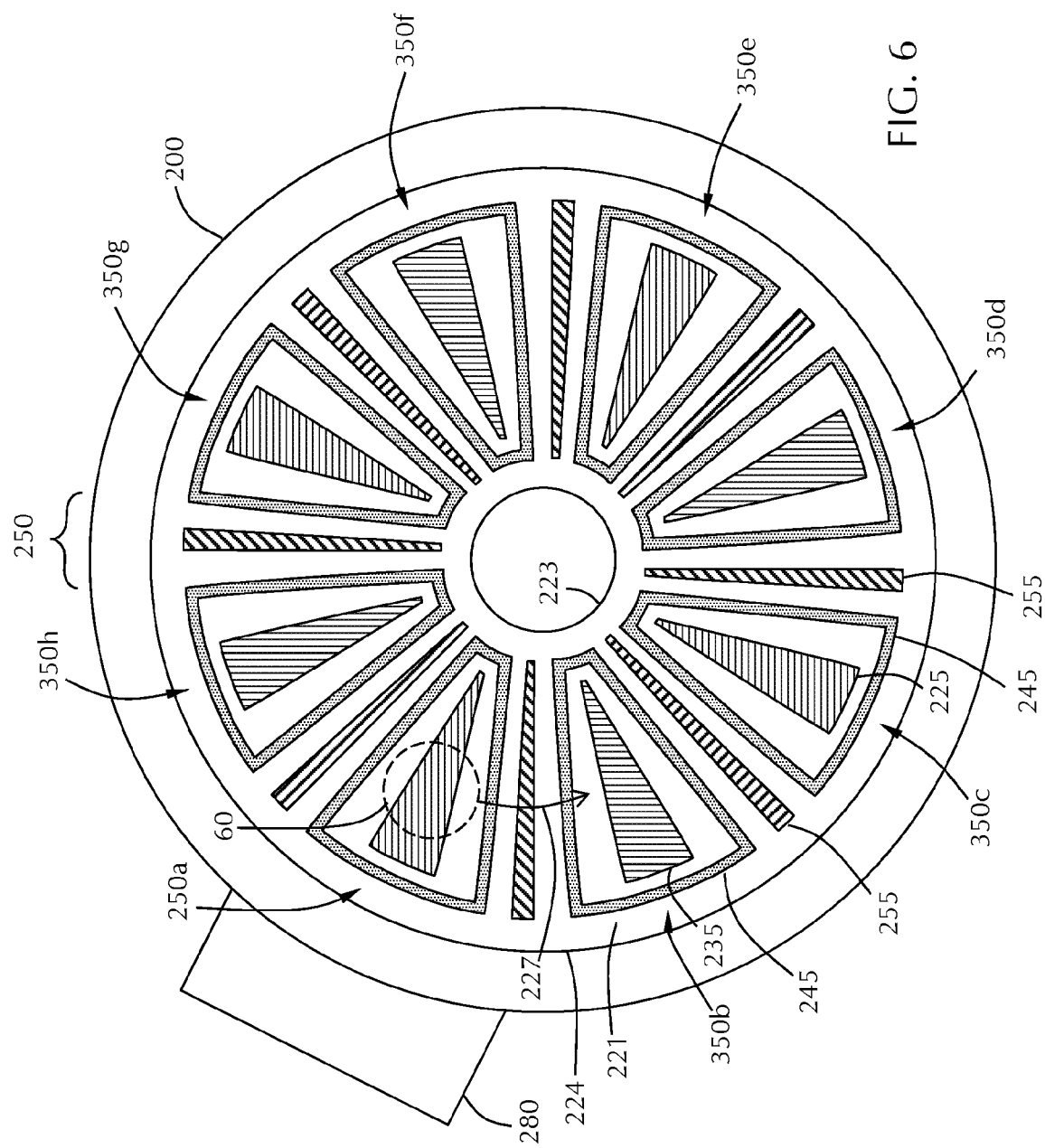
FIG. 6 shows a schematic view of a batch processing chamber in accordance with one or more embodiment of the disclosure.

FIG. 5 shows a sector or portion of a gas distribution assembly 220, which may be referred to as an injector unit 222. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiment may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiment shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas 225 and the second reactive gas 235 to form a layer. The injector unit 222 shown makes a quarter circle but could be larger or smaller. The gas distribution assembly 220 shown in FIG. 6 can be considered a combination of four of the injector units 222 of FIG. 4 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiment shown in FIG. 6 makes up eight separate process regions 350 with eight separate gas curtains 250 between. A processing chamber can have at least two process regions. In some embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface 280, which can be, for example, a load lock chamber, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution plate 220. The substrate 60 is loaded via the factory interface 280 into the processing chamber 200 onto a substrate support or susceptor assembly (see FIG. 4). The substrate 60 can be shown positioned within a process region because the substrate is located adjacent the first reactive gas port 225 and between two gas curtains 250a, 250b. Rotating the substrate 60 along path 227 will move the substrate counter-clockwise around the processing chamber 200. Thus, the substrate 60 will be exposed to the first process region 350a through the eighth process region 350h, including all process regions between.

Some embodiments of the disclosure are directed to processing methods comprising a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a pre-clean chamber 140 connected to a second side 112 of the central transfer station 110. The pre-clean chamber 140 is configured to expose the wafers to one or more of a wet etch comprising dilute (1%) hydrofluoric acid or a dry etch comprising a plasma-based etch. For example, a plasma-based etch process might expose the substrate surface a mixture of ammonia and HF.

In some embodiments, the processing platform further comprises a second batch processing chamber 130 connected to a third side 113 of the central transfer station 110. The second batch processing chamber 130 can be configured similarly to the batch processing chamber 120, or can be configured to perform a different process or to process different numbers of substrates.

The second batch processing chamber 130 can be the same as the first batch processing chamber 120 or different. In some embodiments, the first batch processing chamber 120 and the second batch processing chamber 130 are configured to perform the same process with the same number of wafers in the same batch time so that x and y (the number of wafers in the second batch processing chamber 130) are the same and the first batch time and second batch time (of the second batch processing chamber 130) are the same. In some embodiments, the first batch processing chamber 120 and the second batch processing chamber 130 are configured to have one or more of different numbers of wafers (x not equal to y), different batch times, or both.

In the embodiment shown in FIG. 1, the processing platform 100 includes a second pre-clean chamber 150 connected to a fourth side 114 of the central transfer station 110. The second pre-clean chamber 150 can be the same as the pre-clean chamber 140 or different. In some embodiments, the first and second batch processing chambers 120, 130 are configured to process the same number of wafers in the same batch time (x=y) and the first and second single wafer processing chambers 140, 150 are configured to perform the same process in the same amount of time (1/x=1/y).

The processing platform 100 can include a controller 195 connected to the robot 117 (the connection is not shown). The controller 195 can be configured to move wafers between the pre-clean chamber 140 and the first batch processing chamber 120 with a first arm 118 of the robot 117. In some embodiments, the controller 195 is also configured to move wafers between the second single wafer processing chamber 150 and the second batch processing chamber 130 with a second arm 119 of the robot 117.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

In some embodiments, the controller 195 is configured to move wafers between the first buffer station 151 and one or more of the pre-clean chamber 140 and the first batch processing chamber 120 using the first arm 118 of the robot 117. In some embodiments, the controller 195 is configured to move wafers between the second buffer station 152 and one or more of the second single wafer processing chamber 150 or the second batch processing chamber 130 using the second arm 119 of the robot 117.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the transfer chamber 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the platform 100. A robot 103 within the factory interface 102 can be moved the wafers or cassettes into and out of the buffer stations 151, 152. The wafers or cassettes can be moved within the platform 100 by the robot 117 in the central transfer station 110. In some embodiments, the factory interface 102 is a transfer station of another cluster tool.

In some embodiments, the second pre-clean chamber 150 is a plasma processing chamber. The plasma processing chamber of some embodiments exposes the substrate to a decoupled plasma comprising helium.

Figure 7:
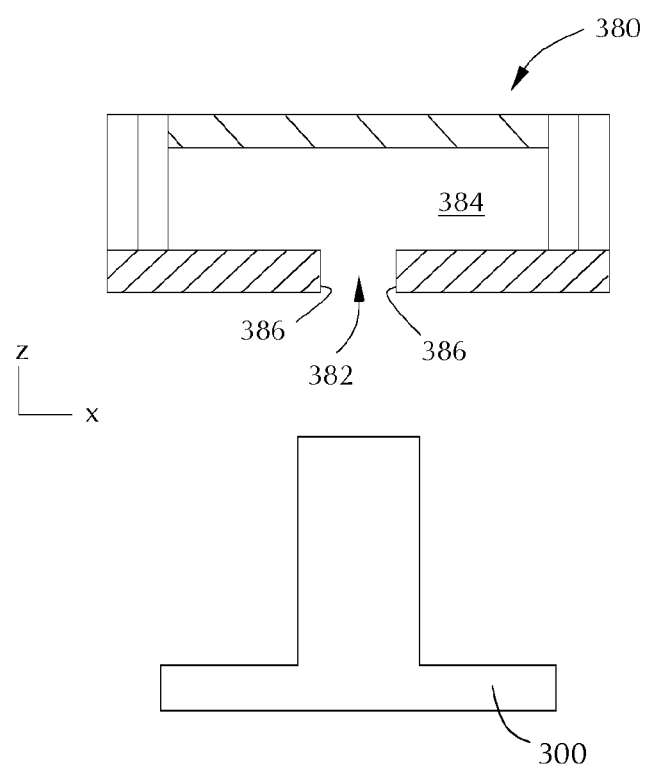
FIG. 7 shows a schematic representation of a method in accordance with one or more embodiment of the disclosure.

Referring to FIG. 7, some embodiments use a plasma assembly 380 with a slot 382. The plasma forms in the plasma cavity 384 and flows through the slot 382 toward the substrate surface 300. The view shown in FIG. 7 is a cross-sectional view in which the slot 382 extends out of the page. The slot 382 through which the plasma formed in plasma cavity 384 flows has edges 386. In some embodiments, the plasma has a high ion energy and concentration adjacent the edges 386 of the slot 382.

One or more embodiments of the disclosure are directed to methods of forming metal oxide films. A metal oxide film can be formed by any suitable method known to the skilled artisan. Suitable methods include, but are not limited to, atomic layer deposition (ALD), chemical vapor deposition (CVD), physical vapor deposition (PVD), epitaxial growth and oxidative growth. In some embodiments, the metal oxide film is deposited or formed by an atomic layer deposition process in which the substrate is sequentially exposed to a metal precursor and a reactant to form the metal oxide.

The metal oxide film can be any suitable metal oxide depending on the process being performed and the device being manufactured. In some embodiments, the metal oxide film is a low-k dielectric, materials with dielectric constants less than about 12 or high-k dielectrics. In some embodiments, the metal oxide comprises aluminum oxide. In some embodiments, the metal oxide consists essentially of aluminum oxide. As used in this specification and the appended claims, the term "consists essentially of aluminum oxide" means that the metal oxide film is greater than or equal to about 95%, 98% or 99% aluminum and oxygen atoms. In some embodiments, the aluminum oxide film comprises less than or equal to about 2.5%, 2.4%, 2.30%, 2.2%, 2.10%, 2.0%, 1.9%, 1.80%, 1.70%, 1.6%, 1.5%, 1.4%, 1.3%, 1.2%, 1.1% or 1.0% carbon, on an atomic basis. In some embodiments, the aluminum oxide film comprises less than or equal to about 0.5%, 0.4%, 0.3%, 0.2% or 0.1% nitrogen, on an atomic basis.

In some embodiments, the metal oxide film comprises aluminum oxide formed by sequential exposure of the substrate to an aluminum precursor and an oxygen reactant. The aluminum precursor can be any suitable compound that can form aluminum oxide. In some embodiments, the aluminum precursor comprises trialkylaluminum or an aluminum halide. In some embodiments, the trialkylaluminum comprises trimethylaluminum (TMA). In some embodiments, the aluminum precursor consists essentially of TMA. As used in this manner, the term "consists essentially of TMA" means that the aluminum containing reactive component of the aluminum precursor is greater than or equal to about 95%, 98% or 99% TMA on a weight basis, excluding the amount diluent, carrier or inert gases that might be included.

The oxygen reactant can be any suitable oxygen reactant that can react with the surface species generated or formed by exposure to the aluminum precursor. In some embodiments, the oxygen reactant comprises one or more of water, oxygen, ozone, peroxide, $N_2O$, $NO_2$ or NO. In some embodiments, the oxygen reactant comprises water vapor. In some embodiments, the oxygen reactant consists essentially of water vapor. As used in this manner, the term "consists essentially of water vapor" means that the oxygen containing reactive species in the oxygen reactant is greater than or equal to about 95%, 98% or 99% water vapor, on a molar basis.

The sequential exposures to the metal precursor and the oxygen reactant can be repeated until a metal oxide film has been formed to a predetermined thickness or to a predetermined number of cycles (each cycle is one exposure to metal precursor and oxygen reactant). In some embodiments, the deposition method comprises a CVD reaction and the metal precursor and oxygen reactant are mixed in the gas phase and the metal oxide film is deposited to a predetermined thickness.

After formation to the predetermined thickness, the metal oxide film is exposed to a decoupled plasma to lower the wet etch rate and/or dry etch rate of metal oxide film. The decoupled plasma can be formed in a remote plasma source (like that of FIG. 7) and allowed to flow into the processing region of the processing chamber to react with the metal oxide film on the substrate. In some embodiments, the decoupled plasma comprises one or more of He, $H_2$ or $O_2$. In some embodiments, the decoupled plasma comprises helium. In some embodiments, the decoupled plasma consists essentially of helium. As used in this manner, the term "consists essentially of helium" means that the plasma species is greater than or equal to about 95%, 98% or 99% helium, on an atomic basis.

In some embodiments, the decoupled plasma comprises helium and oxygen. In some embodiments, the decoupled plasma consists essentially of helium and oxygen. As used in this manner, the term "consists essentially of helium and oxygen" means that the plasma species is greater than or equal to about 95%, 98% or 99% helium and oxygen, on an atomic basis. The ratio of the helium to oxygen in the decoupled plasma can be varied. In some embodiments, the He:O$_2$ ratio is in the range of about 1:10 to about 10:1, or in the range of about 1:5 to about 5:1, or in the range of about 1:2 to about 2:1, or about 1:1.

In some embodiments, the decoupled plasma is a directional plasma. As used in this specification and the appended claims, the term directional plasma means a plasma exposure in which a bias is applied to the substrate or substrate support to drive ions and/or radicals in the plasma to move toward the substrate. A non-directional plasma may have a source power (Ws) applied to the plasma source only. A directional plasma may have a source power (Ws) applied to the plasma source and a bias power (Wb) applied to the substrate or substrate support. In some embodiments, the decoupled plasma is a non-directional plasma and the source power is in the range of about 1000 W to about 5000 W, or about 2000 W.

In some embodiments, the decoupled plasma is a directional plasma and the source power is in the range of about 100 W to about 500 W, or the range of about 200 W to about 400 W, or about 250 W, and the bias power is in the range of about 100 W to about 500 W, or in the range of about 150 W to about 400 W, or about 200 W. In some embodiments, the method comprises a source power and no bias power. As used in this manner, the term "no bias power" means that there is no intentional bias applied to the substrate or substrate support. In some embodiments, the method comprises a source power and a bias power.

The metal oxide film thickness can be deposited to a predetermined amount prior to exposure to the decoupled plasma. In some embodiments, the decoupled plasma is exposed to the metal oxide film more than once during deposition of the final thickness of the metal oxide film. In some embodiments, the substrate is exposed to the decoupled plasma after no more than 20, 30, 40, 50, 60, 70, 80, 90 or 100 atomic layer deposition cycles to deposit the film.

In some embodiments, the wet etch rate of the metal oxide film after exposure to the decoupled plasma is lower than prior to plasma exposure. In some embodiments, the plasma exposed metal oxide film has a wet etch rate in very dilute HF (1:1100 HF:H$_2$O) is less than or equal to about 50 Å/min, 45 Å/min, 40 Å/min, 35 Å/min, 30 Å/min, 25 Å/min, 20 Å/min, 15 Å/min or 10 Å/min. In some embodiments, the wet etch rate in very dilute HF is less than or equal to about 50%, 45%, 40%, 35%, 30%, 25%, 20% or 15% of the wet etch rate of the film prior to exposure to the plasma.

In some embodiments, the plasma exposed metal oxide film has a wet etch rate in a mixture of 1:1:50 hydrogen peroxide:ammonium hydroxide:water at 70° C. less than or equal to about 105 Å/min, 100 Å/min, 95 Å/min, 90 Å/min, 85 Å/min, 80 Å/min, 75 Å/min, 70 Å/min, 65 Å/min, 60 Å/min, 55 Å/min, 50 Å/min, 45 Å/min or 40 Å/min. In some embodiments, the wet etch rate in 1:1:50 hydrogen peroxide:ammonium hydroxide:water at 70° C. is less than or equal to about 50%, 45%, 40%, 35%, 30%, 25%, 20% or 15% of the wet etch rate of the film prior to exposure to the plasma.

EXAMPLES

Aluminum oxide films were deposited by atomic layer deposition using trimethylaluminum and water. The aluminum oxide films were then subjected to decoupled plasmas. The change in thickness of the aluminum oxide films was determined and the results are collected in Table 1. It was observed that the decouple plasma treatment had little to no effect on the thickness of the film.

TABLE 1

| Ws (W) | Wb (W) | Pressure (mT) | Time (s) | ΔThickness (Å) |
|---|---|---|---|---|
| O$_2$/H$_2$ Plasma | | | | |
| 2000 | — | 20 | 180 | 0.2 |
| 2000 | — | 200 | 180 | 1.6 |
| 250 | 225 | 100 | 20 | 1.4 |
| 250 | 225 | 100 | 90 | −2.2 |
| O$_2$/He Plasma | | | | |
| 2000 | — | 20 | 180 | −0.4 |
| 2000 | — | 7 | 180 | −0.3 |
| 250 | 225 | 100 | 20 | 0.4 |
| 250 | 225 | 100 | 90 | −6.0 |
| He Plasma | | | | |
| 2000 | — | 20 | 180 | −0.7 |
| 2000 | — | 7 | 180 | −2.1 |
| 250 | 225 | 100 | 20 | −0.3 |
| 250 | 225 | 100 | 90 | −3.2 |

The effect of the plasma treatment on the film composition showed that the decoupled plasma treatment had little to no effect on the film composition.

The effect of the plasma treatment on the wet etch rate using very dilute HF (1:1100 HF:H$_2$O) at room temperature was measured and the results are shown in Table 2.

TABLE 2

| Ws (W) | Wb (W) | Pressure (mT) | Time (s) | WER (Å/min) |
|---|---|---|---|---|
| O$_2$/H$_2$ Plasma | | | | |
| 2000 | — | 20 | 180 | 90.5 |
| 2000 | — | 200 | \0 | 111.7 |
| 250 | 225 | 100 | 20 | 120.6 |
| 250 | 225 | 100 | 90 | 124.0 |
| O$_2$/He Plasma | | | | |
| 2000 | — | 20 | 180 | 23.8 |
| 2000 | — | 7 | 180 | 21.7 |
| 250 | 225 | 100 | 20 | 116.8 |
| 250 | 225 | 100 | 90 | 120.6 |
| He Plasma | | | | |
| 2000 | — | 20 | 180 | 60.7 |
| 2000 | — | 7 | 180 | 59.7 |
| 250 | 225 | 100 | 20 | 7.4 |
| 250 | 225 | 100 | 90 | 13.4 |
| No Plasma | | | | |
| — | — | — | — | 62.8 |
| — | — | — | — | 62.3 |

The films were also etched using a 1:1:50 mixture of H$_2$O$_2$:NH$_4$OH:H$_2$O at 70° C. and the results are shown in Table 3.

TABLE 3

| Ws (W) | Wb (W) | Pressure (mT) | Time (s) | WER (Å/min) |
|---|---|---|---|---|
| O$_2$/He Plasma | | | | |
| 2000 | — | 20 | 180 | 92.1 |
| 3000 | — | 20 | 90 | 97.2 |
| 2000 | — | 20 | 90 | 104.4 |
| He Plasma | | | | |
| 250 | 200 | 100 | 60 | 72.9 |
| 250 | 400 | 100 | 60 | 36.6 |
| 250 | 225 | 20 | 60 | 50.3 |
| 250 | 225 | 100 | 180 | 143.7 |
| No Plasma | | | | |
| — | — | — | — | 127-130 |

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method comprising:
   forming an aluminum oxide film on a substrate surface by ALD using water as an oxidant; and
   exposing the aluminum oxide film to a decoupled plasma consisting essentially of He, to lower the wet etch rate of the aluminum oxide film to less than 50 Å/min,
   wherein the decoupled plasma is a remote directional plasma, the remote directional plasma formed in a plasma assembly having a slot with edges through which the plasma flows, the plasma having a high ion energy and concentration adjacent the edges of the slot.

2. The method of claim 1, further comprising repeatedly forming the aluminum oxide film and exposing the aluminum oxide film to the decoupled plasma sequentially to deposit the aluminum oxide film to a predetermined thickness.

3. The method of claim 1, wherein forming the aluminum oxide film comprises sequentially exposing the substrate surface to an aluminum precursor and an oxygen reactant.

4. The method of claim 3, wherein the aluminum precursor comprises trimethylaluminum and the oxygen reactant comprises water.

5. The method of claim 1, wherein the aluminum oxide film has a wet etch rate lower than 50 Å/min in 1100:1 water:HF at room temperature or in a mixture of 1:1:50 peroxide:ammonium hydroxide:water at 70° C.

6. The method of claim 1, wherein the aluminum oxide film has a wet etch rate lower than 30 Å/min in 1100:1 water:HF at room temperature.

7. The method of claim 1, wherein the metal oxide film has a wet etch rate lower than 20 Å/min in 1100:1 water:HF at room temperature or less than about 75 Å/min in a mixture of 1:1:50 peroxide:ammonium hydroxide:water at 70° C.

* * * * *

UNITED STATES PATENT AND TRADEMARK OFFICE
CERTIFICATE OF CORRECTION

| | |
|---|---|
| PATENT NO. | : 12,110,589 B2 |
| APPLICATION NO. | : 16/631979 |
| DATED | : October 8, 2024 |
| INVENTOR(S) | : Tatsuya E. Sato et al. |

It is certified that error appears in the above-identified patent and that said Letters Patent is hereby corrected as shown below:

In the Specification

•Column 10, Line 16, replace "2.30%" after "about 2.5%, 2.4%," and before ", 2.2%," with "2.3%".

•Column 10, Line 16, replace "2.10%" after "2.2%" with "2.1%".

•Column 10, Line 17, replace "1.80%, 1.70%," after "2.0%, 1.9%," and before "1.6%, 1.5%" with "1.8%, 1.7%,".

Signed and Sealed this
Nineteenth Day of November, 2024

Katherine Kelly Vidal
*Director of the United States Patent and Trademark Office*